US008296622B2

(12) United States Patent
Shih et al.

(10) Patent No.: US 8,296,622 B2
(45) Date of Patent: Oct. 23, 2012

(54) PROGRAMMABLE LDPC CODE DECODER AND DECODING METHOD THEREOF

(75) Inventors: Xin Yu Shih, Taipei (TW); An Yeu Wu, Taipei (TW)

(73) Assignee: National Taiwan University, Taipei (TW)

( * ) Notice: Subject to any disclaimer, the term of this patent is extended or adjusted under 35 U.S.C. 154(b) by 315 days.

(21) Appl. No.: 12/805,978

(22) Filed: Aug. 27, 2010

(65) Prior Publication Data
US 2011/0289382 A1    Nov. 24, 2011

(30) Foreign Application Priority Data
May 18, 2010    (TW) ................ 99115865 A

(51) Int. Cl.
*G06F 11/00*    (2006.01)

(52) U.S. Cl. ........................ 714/758; 714/794

(58) Field of Classification Search .............. 714/758, 714/768, 789, 791, 794, 795, 798; 375/262, 375/265, 341
See application file for complete search history.

(56) References Cited

U.S. PATENT DOCUMENTS

| 7,971,129 B2 * | 6/2011 | Watson et al. ............... 714/784 |
| 8,151,031 B2 * | 4/2012 | Biscondi et al. ............... 711/5 |
| 8,201,047 B2 * | 6/2012 | Sakai et al. ............... 714/755 |

* cited by examiner

*Primary Examiner* — Dieu-Minh Le
(74) *Attorney, Agent, or Firm* — Bacon & Thomas, PLLC

(57) ABSTRACT

A programmable LDPC (Low-Density Parity-Check) code decoder and decoding method thereof is disclosed. By combining at least one programmable switch and at least one memory unit to decode any quasi-cyclic-based parity check matrix, one can set the switch state of the programmable switch to dynamically adjust the size of the decoding matrix and determine the locations of 1's and 0's in the decoding matrix. The mechanism helps improving the usability and flexibility of the decoding matrix.

17 Claims, 10 Drawing Sheets

| j\i | 1 | 2 | 3 | 4 | 5 | 6 | 7 | 8 | 9 | 10 | 11 | 12 |
|---|---|---|---|---|---|---|---|---|---|---|---|---|
| 1 | 63 | -1 | 109 | -1 | 43 | -1 | 1 | 0 | -1 | -1 | -1 | -1 |
| 2 | -1 | 21 | -1 | 17 | -1 | 88 | -1 | 0 | 0 | -1 | -1 | -1 |
| 3 | -1 | 115 | 91 | 86 | 25 | -1 | 0 | -1 | 0 | 0 | -1 | -1 |
| 4 | 97 | 56 | 12 | -1 | 123 | -1 | -1 | -1 | -1 | 0 | 0 | -1 |
| 5 | 48 | -1 | 4 | 66 | -1 | 51 | -1 | -1 | -1 | -1 | 0 | 0 |
| 6 | -1 | 67 | 32 | -1 | 70 | 6 | 1 | -1 | -1 | -1 | -1 | 0 |

| Clock | (i,j) | P1 | P2 | P3 |
|---|---|---|---|---|
| 1 | (1,1) | 1 | 1 | 63 |
| 2 | (1,2) | - | 1 | 3 |
| ...... | ...... | ...... | ...... | ...... |
| 70 | (12,4) | - | 0 | - |
| 71 | (12,5) | - | 1 | 0 |
| 72 | (12,6) | - | 1 | 0 |

P1 = en_flag$_i$    P2 = en_flag$_{i,j}$    P3 = Base_Addr$_{i,j}$

- don't care

FIG. 6B

PROGRAMMABLE LDPC CODE DECODER AND DECODING METHOD THEREOF

BACKGROUND OF THE INVENTION

1. Field of Invention

The invention relates to a decoder and the decoding method thereof. In particular, the invention relates to a programmable Low-Density Parity-Check (LDPC) decoder that combines a programmable switch and a memory unit and the method thereof.

2. Related Art

Due to the improvements in semiconductor manufacturing processes and rapid developments in communication systems in recent years, not only are the communication systems using LDPC encoding realized, they always receive wide attentions because of their superior decoding efficiency and their ability in achieving the Shannon limit. The Shannon limit is the theoretical minimal bit error rate in a communication channel under a specific signal-to-noise ratio (SNR).

Generally speaking, a single-mode LDPC code decoder is to only decode a single fixed decoding matrix. However, such a decoder is not suitable for different communication environments. It is therefore not appropriate for future channel-adaptive communication systems.

In view of the foregoing, some vendors provide several decoding matrices in the decoder (the so-called multiple modes), so that the user can select an appropriate decoding matrix for different communication qualities. When interference in the communication channel becomes strong, one has to use a decoder with a larger decoding matrix. However, this method still cannot allow the user to arbitrarily adjust the size of the decoding matrix. Therefore, it still cannot be used in channel-adaptive communication systems.

In summary, the prior art has the problem that the decoders are not channel-adaptive. It is therefore desirable to provide a better technique.

SUMMARY OF THE INVENTION

The invention provides a programmable LDPC code decoder and the decoding method thereof.

The disclosed programmable LDPC code decoder includes: a receiving module, a memory module, a setting module, a computing module, and an output buffer module. The receiving module receives log-likelihood ratio (LLR). The memory module includes a switched mutual-information memory (SMM) and a switched channel-value memory (SCM). The SMM stores the exchanged information of the decoding matrix. The number of SMM's is related to the size of a maximal base parity check matrix. Suppose the base parity check matrix has the dimension M*N. Then one needs M*N SMM's to form the M*N decoding matrix. In addition, the SMM electrically connects to a check node unit (CNU) via a first switch and to a bit node unit (BNU) via a second switch. The SCM stores the LLR, and electrically connects to the BNU via a third switch, providing numbers required for decoding. The setting module receives setting parameters, and sets the states of the first switch, the second switch, and the third switch according to the setting parameters. The computing module receives the LLR. After the switch state settings are complete, horizontal updating is performed on the decoding matrix via the CNU. A set of decoding bits is generated by performing vertical updating on the decoding matrix via the BNU. The output buffer module outputs the set of decoding bits after the horizontal and vertical updates are done.

It should be noted that the device can further include a circuit module with a wordlength determination unit (WDU) and an early termination unit (ETU) for executing adaptive wordlength assignment (AWA) and efficient early termination scheme (EETS). Besides, the device further has a control unit electrically connected with the SMM's and the SCM's for counting and controlling the operations of other units. The WDU and the ETU electrically connect to the BNU simultaneously. The WDU generates a control signal to control the ETU and the BNU's. In addition, the number of CNU's is M, and the numbers of BNU's and SCM's are both N, where M and N are positive integers and M<N. The SMM is mainly a two-port register file, and the SCM is primarily a single-port register file. The above-mentioned parameter settings determine whether the SMM's and the SCM's are enabled or disabled. When the SMM is enabled, the states of the first switch and the second switch are switched on. When the SCM is enabled, the state of the third switch is switched on.

The disclosed programmable LDPC decoding method includes the steps of: providing SMM's and SCM's for decoding a base parity check matrix of dimension M*N, each of the SMM's having a first switch and a second switch and each of the SCM's has a third switch; receiving setting parameters and setting the states of the first switch, the second switch, and the third switch accordingly; receiving LLR and storing the LLR to the SCM; after receiving the LLR and setting the switch states, performing horizontal updating on the decoding matrix with a CNU and vertical updating with a BNU; outputting the decoding bits after the horizontal updating and vertical updating are done.

The above-mentioned programmable LDPC decoding method further includes the step of using the WDU and the ETU to perform AWA and EETS. The SMM and the SCM electrically connect to the control unit for counting. The WDU generates a control signal to control the ETU and the BNU's. Besides, the number of CNU's is M, and the numbers of BNU's and SCM's are both N, where M and N are positive integers and M<N. The SMM is mainly a two-port register file, and the SCM is primarily a single-port register file. The above-mentioned parameter settings determine whether the SMM's and the SCM's are enabled or disabled. When the SMM is enabled, the states of the first switch and the second switch are switched on. When the SCM is enabled, the state of the third switch is switched on.

As described above, the disclosed decoder and decoding method differ from the prior art in that the invention combines the programmable switches and memory units to decode quasi-cyclic-based parity check matrix of dimension M*N. The states of the programmable switches are set to adjust the size of the target decoding matrix and to determine the positions of '0' and '1' therein.

Using the above technique, the invention can improve the usability and flexibility of the decoding matrix.

BRIEF DESCRIPTION OF THE DRAWINGS

The invention will become more fully understood from the detailed description given herein below illustration only, and thus is not limitative of the present invention, and wherein:

FIGS. 6A and 6B are schematic views of converting the LDPC codes into setting parameters according to the invention;

DETAILED DESCRIPTION OF THE INVENTION

The present invention will be apparent from the following detailed description, which proceeds with reference to the accompanying drawings, wherein the same references relate to the same elements.

Figure 1:
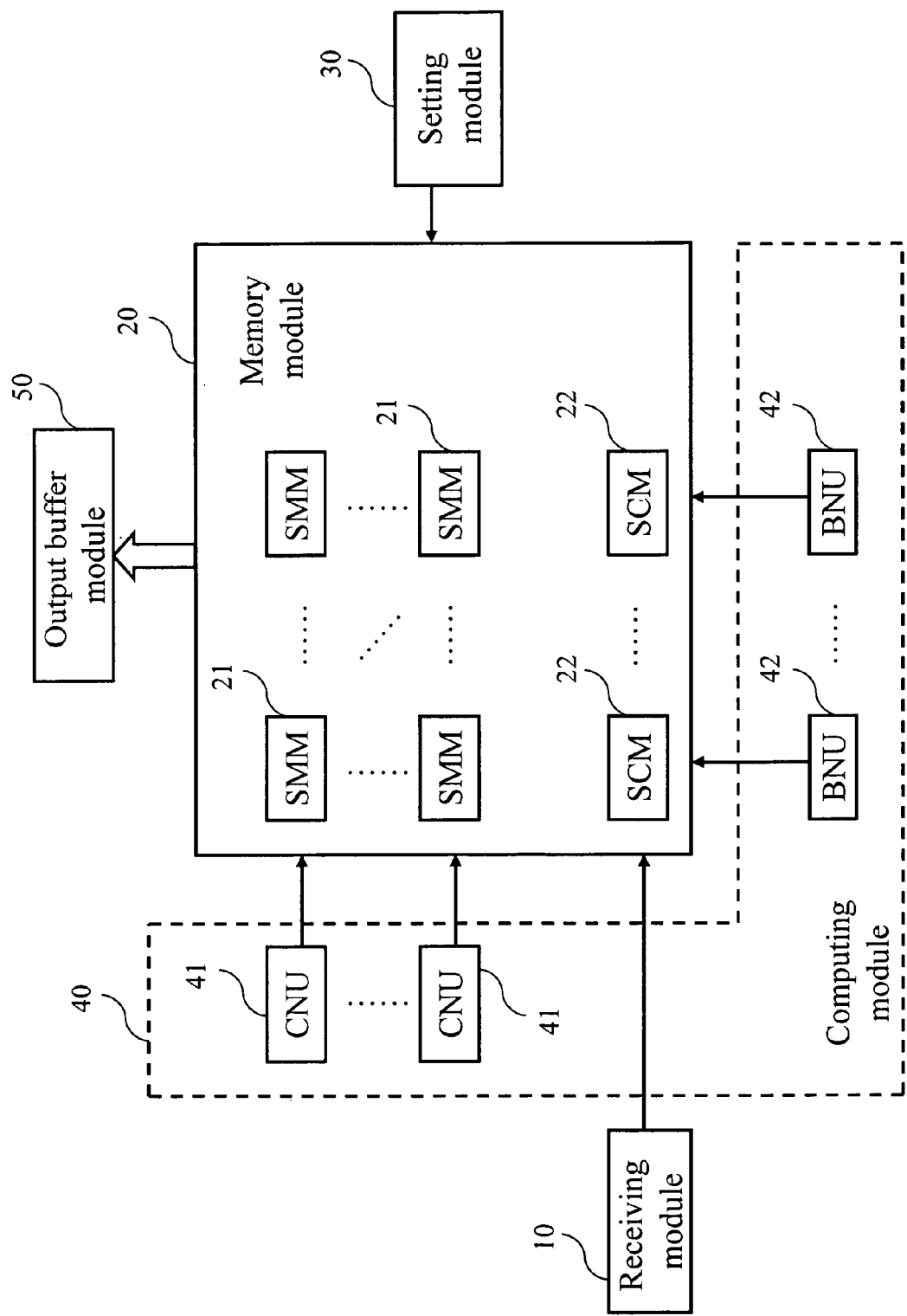
FIG. 1 is a block diagram of the disclosed programmable LDPC code decoder.

We first describe the disclosed programmable LDPC code decoder. Please refer to FIG. 1 for a block diagram of the disclosed programmable LDPC code decoder. The programmable LDPC code decoder according to the invention includes: a receiving module 10, a memory module 20, a setting module 30, a computing module 40, and an output buffer module 50. The receiving module 10 receives an initial channel value, which is also called the log-likelihood ratio (LLR). Since the LLR belongs to the prior art, it is not further explained herein.

The memory module 20 includes: SMM's 21 and SCM's 22. The SMM 21 stores the information exchanged within the decoding matrix. The SMM 21 electrically connects to a CNU 41 via its own first switch 212. The SMM 21 electrically connects to a BNU 42 via its own second switch 213. The SCM 22 stores the LLR received by the receiving module 10. The SCM 22 electrically connects to a BNU 42 via its own third switch 222. It should be noted that the number of the CNU's 41 is M, and the numbers of the BNU's 42 and the SCM's 22 are both N, where M and N are both positive integers with M<N. For example, suppose the maximal base parity check matrix has dimension 6*12. The number of CNU's 41 is 6, and the numbers of BNU's 42 and SCM's 22 are both 12. In practice, the SMM 21 is mainly a two-port register file, and the SCM 22 is primarily a single-port register file. A detailed circuit of this part will be given later.

The setting module 30 receives setting parameters and executes the setting parameters to set the states of the first switch 212, the second switch 213, and the third switch 222 (e.g., switching to 'ON' or 'OFF'). As mentioned before, the largest dimension of base parity check matrix supported by the structure of the invention is M*N. In practice, the rows (≦M) and columns (≦N) of the decoding matrix are set by the setting parameters (programmable). For example, suppose the largest dimension of the base parity check matrix is 3*6. The SMM 21 is a 6*12 matrix. When the user wants to set the decoding matrix to have the dimension 3*6, he or she can enable the corresponding SMM's 21 and the SCM's 22 after parameter setting. This action switches the states of the first switch 212 and the second switch 213 to compose the 3*6 decoding matrix. The other unused memory units are disabled. Besides, the next row of the decoding matrix is enabled with 6 corresponding SCM's 22. The state of the third switch 222 is switched as well.

After receiving the LLR and completing the switch state setting, the computing module 40 performs horizontal updating on the decoding matrix via the CNU's 41 and vertical updating via the BNU's 42, thereby generating decoding bits. Since the method of generating the decoding bits is well-known, it is not further described herein.

After the computing module 40 finishes horizontal updating and vertical updating, the output buffer module 50 outputs the decoding bits generated thereby. In practice, the output buffer module 50 is volatile memory, such as dynamic random access memory (DRAM) and electrically connects to the corresponding BNU 42.

Moreover, the decoder can further include a circuit module that has a WDU 61 and an ETU 62 to execute AWA and EETS. The WDU 61 and the ETU 62 electrically connect to the BNU's 42, simultaneously. Besides, the decoder further has a control unit for electrically connecting to the SMM 21 and the SCM 22 and for counting. The circuit module and the control unit will be explained in further detail with reference to the corresponding figures later.

Figure 2:
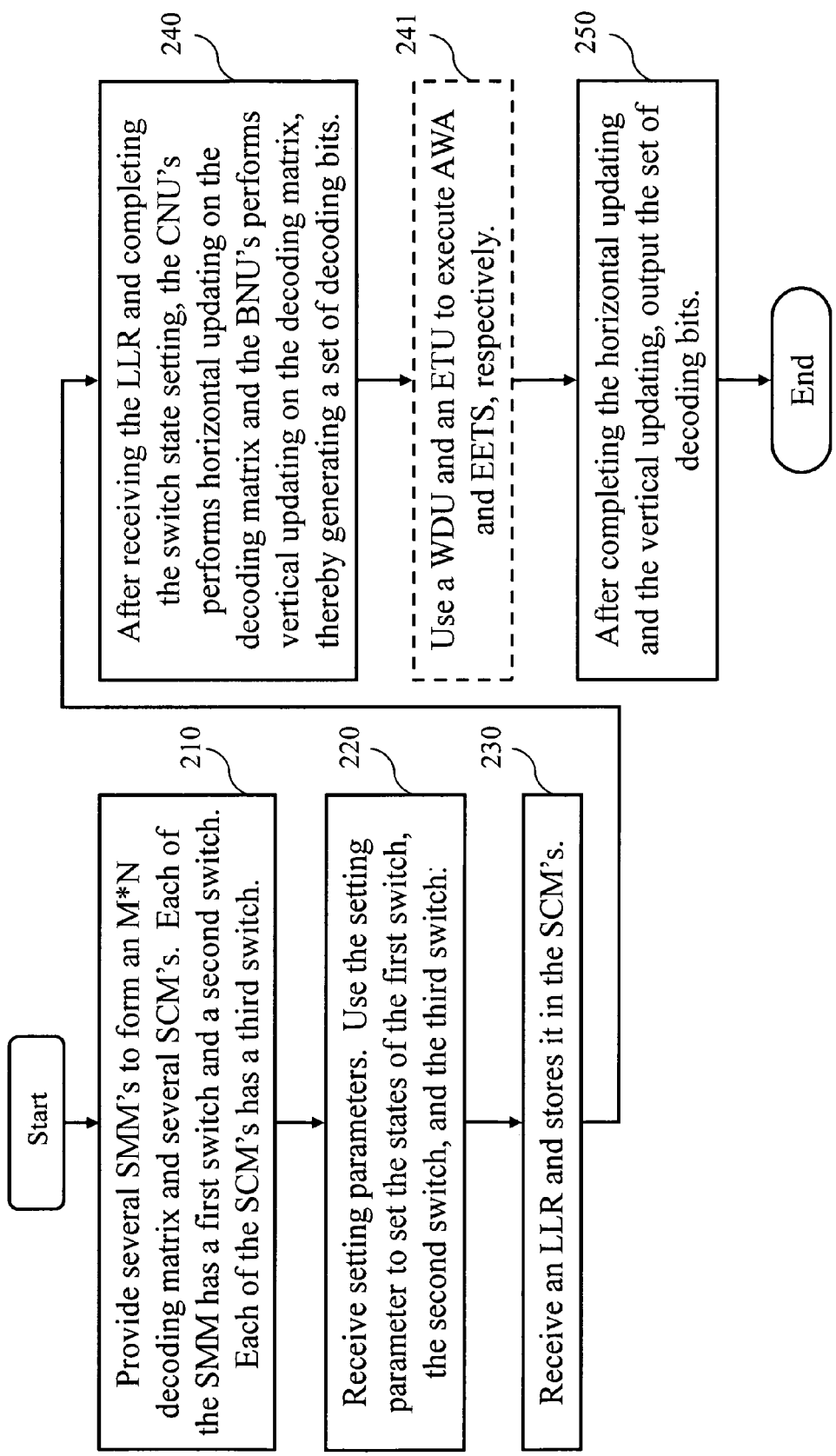
FIG. 2 is a flowchart of the disclosed programmable LDPC decoding method.

FIG. 2 is a flowchart of the disclosed programmable LDPC decoding method. The method according to the invention includes the following steps. In step 210, SMM's 21 with first switches 212 and second switches 213 and SCM's 22 with third switches 222 are provided for decoding the base parity check matrix of dimension M*N. In step 220, setting parameters are received and used to set the states of the first switch 212, the second switch 213, and the third switch 222. In step 230, the LLR is received and stored to the SCM 22. In step 240, after the LLR is received and the switch states are set, the CNU 41 performs horizontal updating on the decoding matrix and the BNU 42 performs vertical updating on the decoding matrix in order to generate decoding bits. After the horizontal updating and the vertical updating are completed, the decoding bits are output in step 250. Through the above-mentioned steps, programmable switches and memory units can be combined to decode the LDPC base parity check matrix of dimension M*N. The states of the programmable switches are dynamically adjusted to determine the size of the decoding matrix 201.

Moreover, after step 240, the WDU 61 and the ETU 62 further execute AWA and EETS, respectively (step 241). The WDU 61 and the ETU 62 will be detailed later with reference to the accompanying figures.

Figure 3:
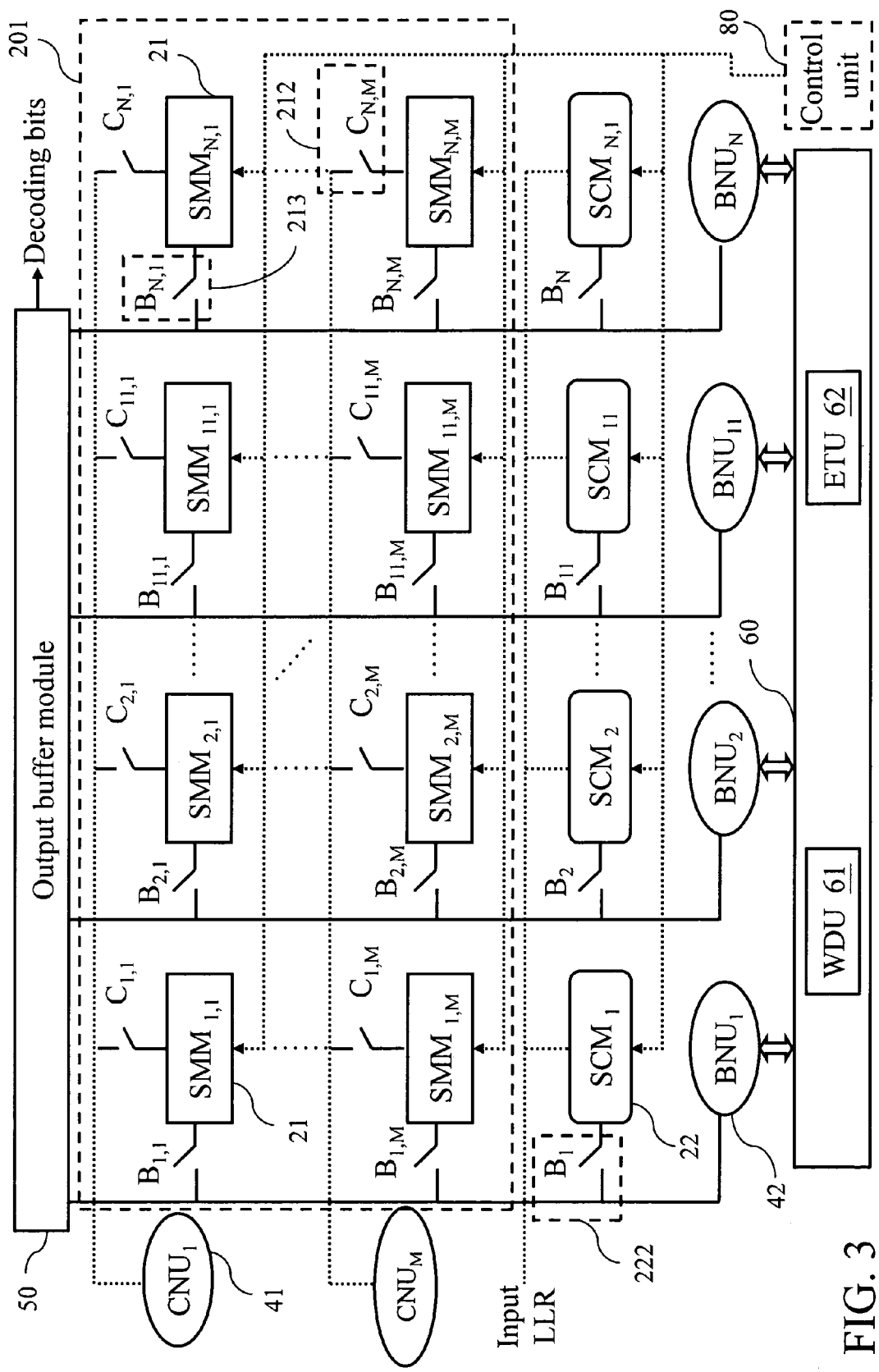
FIG. 3 schematically shows the structure of the disclosed storage module.

An embodiment of the invention is explained with reference to FIGS. 3 to 9. Please refer to FIG. 3 for the structure that uses the disclosed storage module. The structure includes: SMM's 21 and SCM's 22. In practice the SMM's 21 can be disposed to form an M*N decoding matrix 201 (i.e., $SMM_{1,1}$ to $SMM_{N,M}$), as shown in FIG. 3. The decoding matrix 201 stores the message-passing between the CNU's 41 and the BNU's 42. This decoding matrix 201 has a direct mapping with an M-by-N base parity check matrix. Besides, each of the SMM's 21 electrically connects to the CNU 41 via the first switch 212 and to the BNU 42 via the second switch 213.

Suppose the size of the base parity check matrix is M*N, where M is the number of rows and N is the number of columns. The number of the CNU's 41 is M, and the numbers of the BNU's 42 and the SCM's 22 are both N. The SCM 22 stores the LLR. It should be noted that the SMM's 21 and the SCM's 22 are not traditional fixed storage elements. The SMM 21 electrically connects to the CNU 41 and the BNU 42 via the programmable switches (the first switch 212 and the second switch 213, respectively). The SCM 22 electrically connects to the BNU 42 via the programmable switch (the third switch 222).

In addition, the BNU 42 can practically connect to a circuit module 60, which includes a WDU 61 and an ETU 62 for executing AWA and EETS, respectively. The BNU 42 electrically connects to the output buffer module 50 for outputting a set of decoding bits via the output buffer module 50. Moreover, the SMM's 21 and the SCM's 22 electrically connect to the control unit 80 of the counter for setting memory addresses. It should be emphasized that the invention does not impose restrictions on the numbers and arrangement of the SMM's 21 and the SCM's 22. They can be substitute by an equivalent circuit of the same functions without departing from the spirit of the invention.

Using the above-mentioned memory module 20, the user can determine the locations of '0' and '1' in the decoding matrix 201 by setting the SCM's 22 and the SMM's 21. The required number of clock cycles is M*N. For example, suppose the base parity check matrix has the dimension 6*12. It thus takes 72 clock cycles to set the SMM's 21 and the SCM's 22 for the decoding matrix 201.

Figure 4:
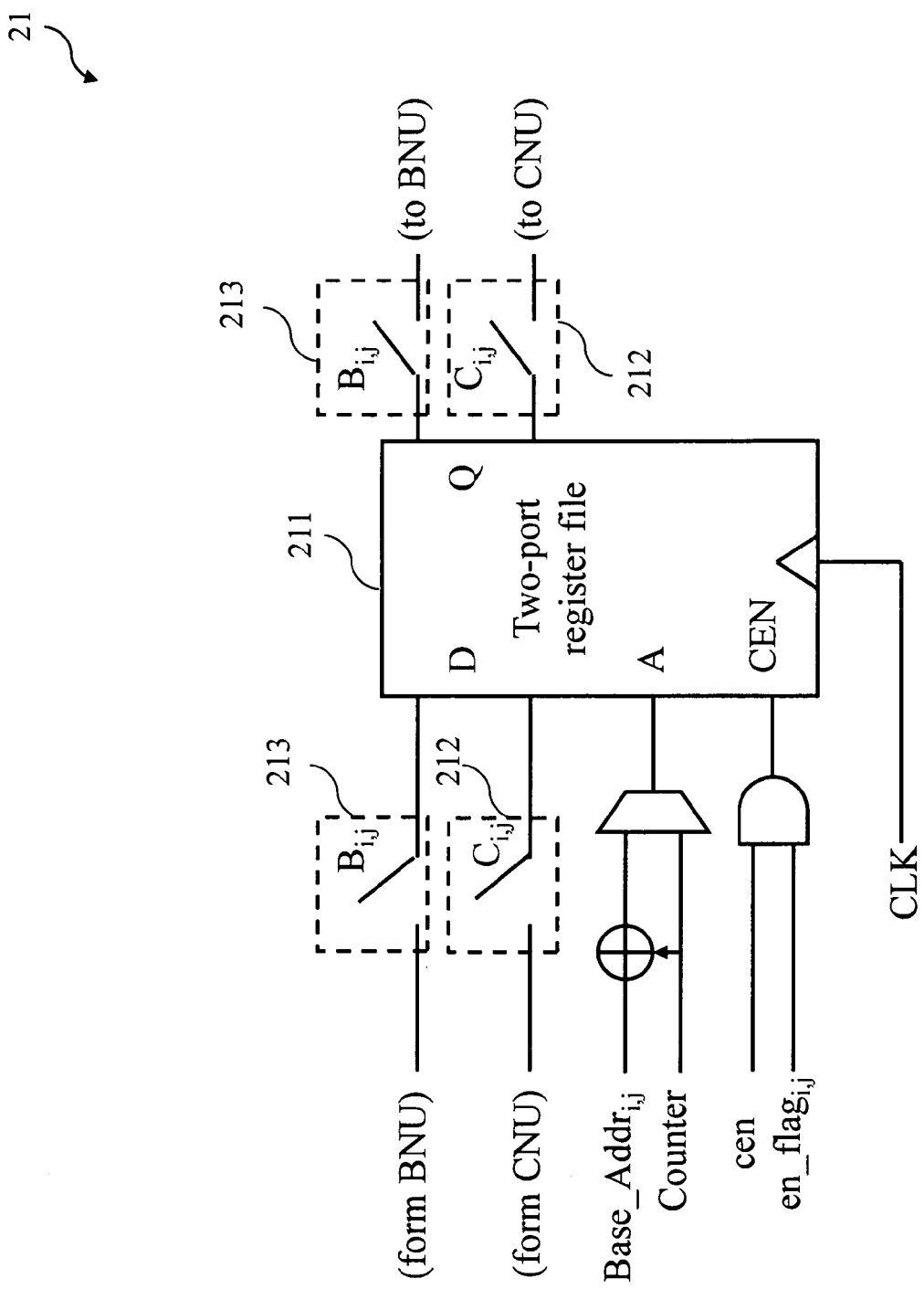
FIG. 4 is a schematic view of the circuit of the SMM according to the invention.

FIG. 4 is a schematic view of the circuit in the disclosed SMM. In practice, the SMM 21 primarily consists of a two-port register file 211. The two-port register file 211 has an end D, an end A, and an end CEN for inputs, and an end Q for outputs. End D receives messages from the CNU 41 via the first switch 212 or from the BNU 42 via the second switch 213. End A receives addresses. End CEN receives the signal 'en_flag$_{i,j}$' for enabling or disabling the SMM 21. End Q outputs data.

Suppose the signal 'en_flag$_{i,j}$' is '1', and the corresponding first switch 212 is closed and the second switch 213 is open while the horizontal updating. The computed value 'Base_Addr$_{i,j}$+Counter' is transmitted to end A. The messages between the SMM 21 and the CNU 41 can be successfully transmitted. On the other hand, suppose the signal 'en_flag$_{i,j}$' is '1', and the corresponding first switch 212 is open and the second switch 213 is closed while the horizontal updating. The signal 'Counter' generated by the control unit 80 is directly transmitted to end A. Simultaneously, the third switch 222 of the SCM 22 is switched to electrically connect with the BNU 42. The signal 'en_flag$_{i,j}$' can be set as '0' or '1' in the clock cycle of $[(i-1)*M+j]^{th}$, $1 \leq i \leq N$, $1 \leq j \leq M$.

Figure 5:
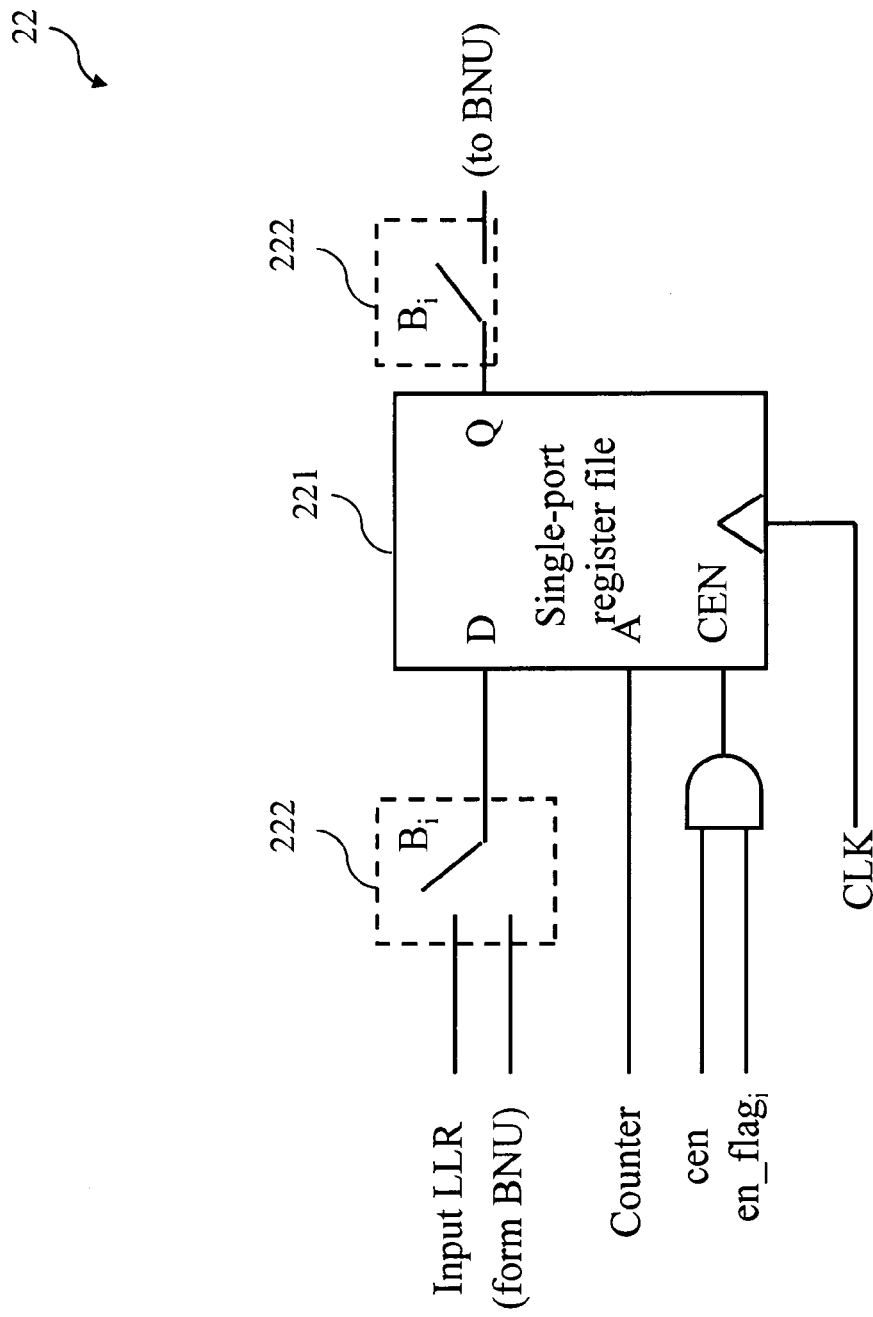
FIG. 5 is a schematic view of the circuit of the SCM according to the invention.

FIG. 5 is a schematic view of the circuit in the disclosed SCM. In practice, the SCM 22 primarily consists of a single-port register file 221. It differs from the above-mentioned SMM 21 in that end D and end Q are both single port instead of double ports, that the LLR is received via the third switch 222 and stored, and that end A directly receives the signal 'Counter'. The signal 'en_flag$_i$' can be set as '0' or '1' in the clock cycle of $[(i-1)*M+1]^{th}$, $1 \leq i \leq N$.

As mentioned before, setting the signals 'en_flag$_i$' and 'en_flag$_{i,j}$' as '1' or '0' can correspondingly enable or disable the SCM 22 and the SMM 21. Therefore, one can disable the SCM's 22 and the SMM's 21 that are not needed in order to lower power and have variable code rates. The variable code rate means that the code rate varies with the numerical values M and N in the M*N decoding matrix 201. For example, suppose there is a base parity check matrix H'$_{Ms*Ns}$, where Ms and Ns are two positive integers and Ms<Ns. In this case, the code rate is defined as 1−(Ms/Ns). If Ms and Ns are 3 and 6, respectively, the code rate is then ½ (i.e., 1−(3/6)). Therefore, within the largest decoding matrix (dimension M*N), the user can arbitrarily determine the dimension of the target decoding matrix as Ms*Ns, where Ms≦M and Ns≦N. The code rate changes accordingly.

Besides, each element in the base parity check matrix H'$_{Ms*Ns}$ can be expanded into p*p sub-matrices, where p is called the extending factor. If the element is '0', then the sub-matrix is a null matrix $0_p*_p$. If the element is '1', then it can be expanded into a cyclic shift matrix $T_p*_p$. The element value in the cyclic shift matrix $T_p*_p$ represents the number of bits that elements in the identity matrix I need to be cyclically shifted to the right. For example, suppose a 3*3 identity matrix I is written as {(1, 0, 0), (0, 1, 0), (0, 0, 1)}. If the element value in the cyclic shift matrix $T_p*_p$ is '1', then the identity matrix needs to be cyclically shifted to the right as {(0, 1, 0), (0, 0, 1), (1, 0, 0)}. After extending the base parity check matrix H'$_{Ms*Ns}$, the entire matrix is viewed as the decoding matrix $H_m*_n$, where Ms*P=m and Ns*P=n.

FIGS. 6A and 6B are schematic views of converting the LDPC code into setting parameters according to the invention. As mentioned before, the setting module 30 sets the parameters, thereby setting the states of the first switch 212 and the second switch 213 of each of the SMM's 21 and the third switch 222 of each of the SCM's 22. In practice, the parameter setting is predetermined by the user according to the LDPC coding for the setting module 30 to execute. For example, suppose the LDPC codes is as shown in FIG. 6A to be the 6*12 example matrix 300. The example matrix 300 contains negative number '−1' and non-negative numbers, such as '0', '63', '3', etc. The parameter setting is done according to the parameter setting table 310 shown in FIG. 6B. Here 'Clock' represents the clock cycle, 'P1' represents parameter 1 (i.e., the value of the signal 'en_flag$_i$'), 'P2' represents parameter 2 (i.e., the value of the signal 'en_flag$_{i,j}$'), and 'P3' represents parameter 3 (i.e., the value of the signal 'Base_Addr$_{i,j}$'). Take Clock=1 as an example. This means that during the first clock cycle, the setting module 30 sets the value of the signal 'en_flag$_i$' of the SCM$_1$ 22 as '1' (i.e., enabled), the value of the signal 'en_flag$_{i,j}$' of the SMM$_{1,1}$ 21 as '1' (i.e., enabled), and the value of the signal 'Base_Addr$_{i,j}$' as '63. It should be noted that represents 'don't care'. That is, the value can be set as '1' or '0'. When an element of the example matrix 300 is '−1', the signal 'en_flag$_{i,j}$' is numerically '0' (i.e., disabled).

Figure 7:
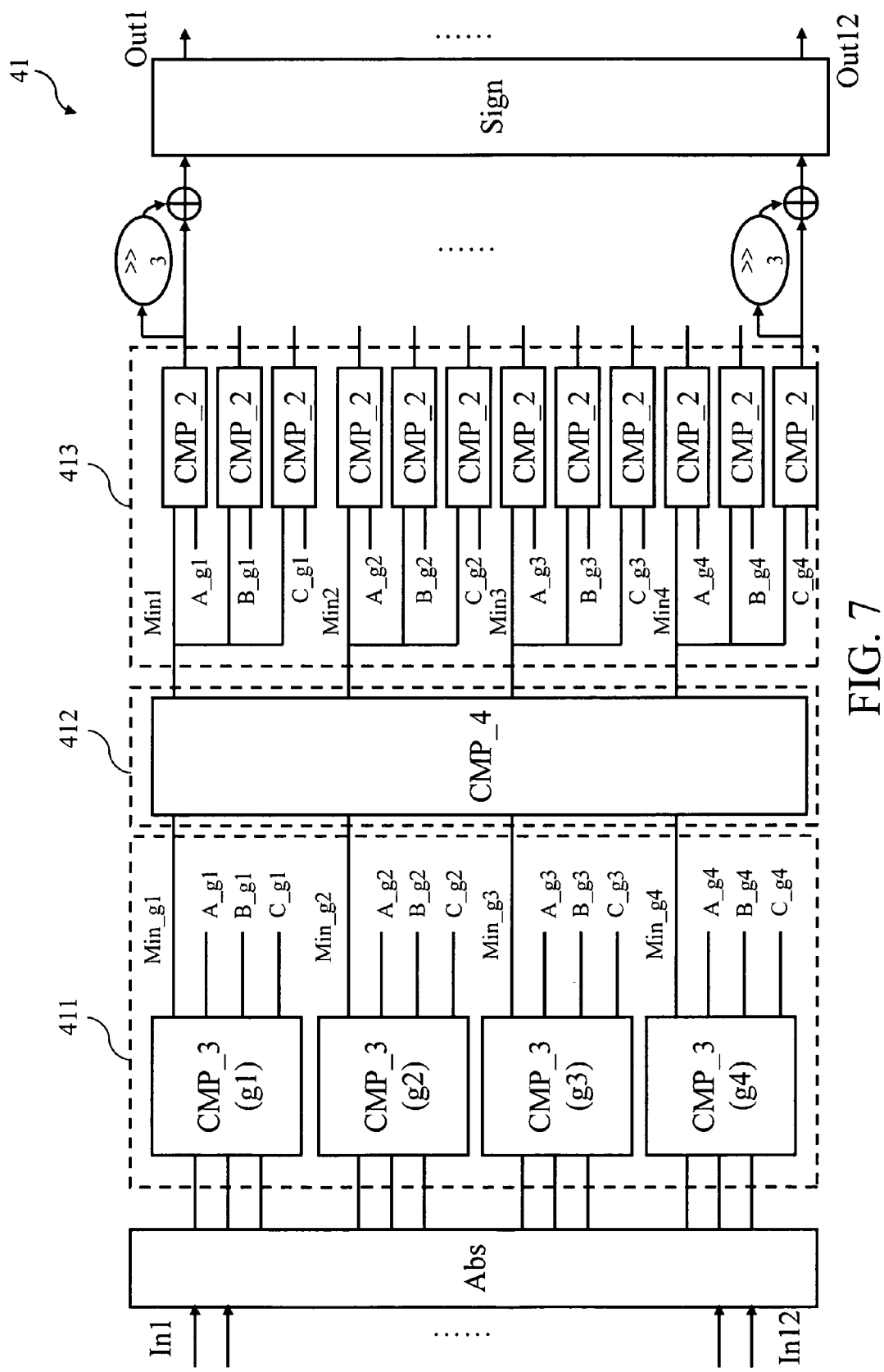
FIG. 7 is a schematic view of the circuit of the disclosed CNU.

FIG. 7 is a schematic view of the circuit of the disclosed CNU. In practice, the CNU 41 can be implemented in combination with a divided-group comparison (DGC). Take the CNU 41 in the drawing as an example. It has 12 inputs, In1~In12. The comparison is divided into three stages (first stage 411, second stage 412, and third stage 413). In the first stage 411, the 12 input signals are divided into four groups (g1, g2, g3, and g4), each of which has 3 input signals. The minimum of each group (Min_g1, Min_g2, Min_g3, and Min_g4, respectively) is output to the second stage 412. The minimum of any two input signals in each group is output to the third stage 413. For example, g1 has three input signals: a, b and c, respectively. Then A_g1 is the minimum of b and c, B_g1 is the minimum of a and c, and C_g1 is the minimum of a and b. In the second stage 412, the minimum output in the first stage 411 is output in parallel (Min1, Min2, Min3, and Min4), as shown in FIG. 7. In the third stage 413, the three outputs (e.g., A_g1, B_g1 and C_g1) from each group in the first stage 411 are compared with the minimum of the corresponding group (e.g., Min1) in parallel, so that all the groups totally output 12 output signals. This method can be used in a system of CNU's 41 with different numbers of inputs, in order to reduce the computational complexity of 'log$_3$Num', where 'Num' represents the input quantity of the CNU 41. It should be emphasized that the invention does not restrict the input quantity and grouping scheme of the CNU's 41. They can be substituted by equivalent circuits without departing from the spirit of the invention.

Figure 8:
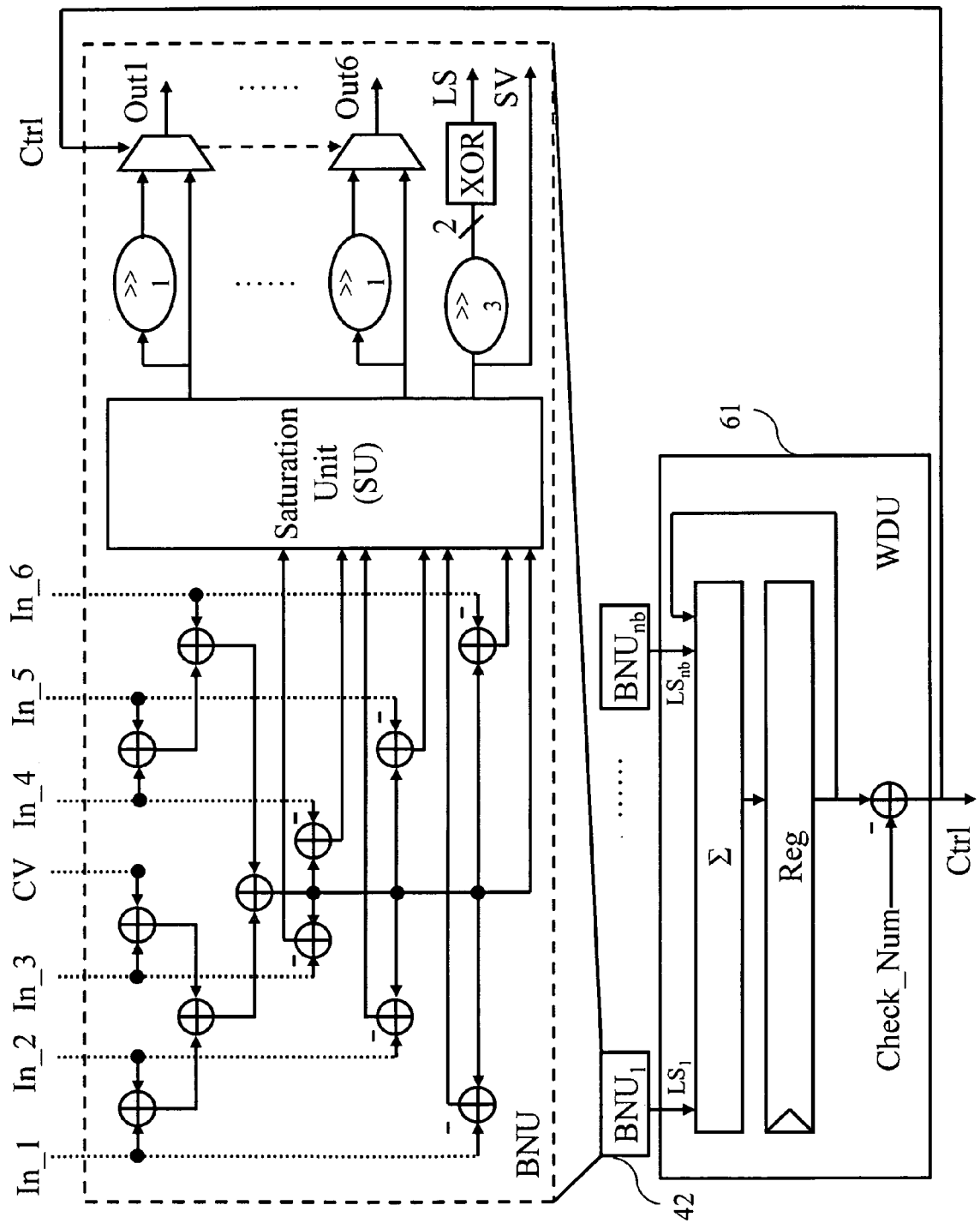
FIG. 8 is a schematic view of the circuits of the disclosed WDU and BNU.

FIG. 8 is a schematic view of the circuits of the disclosed WDU and BNU. As mentioned before, the WDU 61 performs AWA. Traditionally, during an iteration process, the wordlength assignment is fixed. For example, integers are represented by three bits and decimal numbers are represented by two bits by default. However, the above-mentioned wordlength assignment does not have flexibility and also limits the overall decoding efficiency. Therefore, the invention provides an AWA method with more flexibility. First, the method checks whether the absolute value of each soft value (SV) is greater than 2. If so, the LS signal is set as '1'; otherwise, the LS signal is set as '0'. Afterwards, the values of all LS signals are summed up to see if the result is greater than a threshold, Check_Num. A corresponding control signal 'Ctrl' is generated to control whether the BNU 42 adjust the number of bits for the integer and decimal parts. The threshold can be defined by the user.

For example, suppose the accumulated value is greater than the threshold Check_Num. A control signal 'Ctrl' is generated to shift all bits of the BNU 42 to the left. The integer part is then represented by four bits and the decimal part by one bit. Otherwise, the default bits can be used. As a result, the total number of bits being used is invariant, while more bits (four bit here) can be used to represent the integer. This achieves the goal of AWA.

Figure 9:
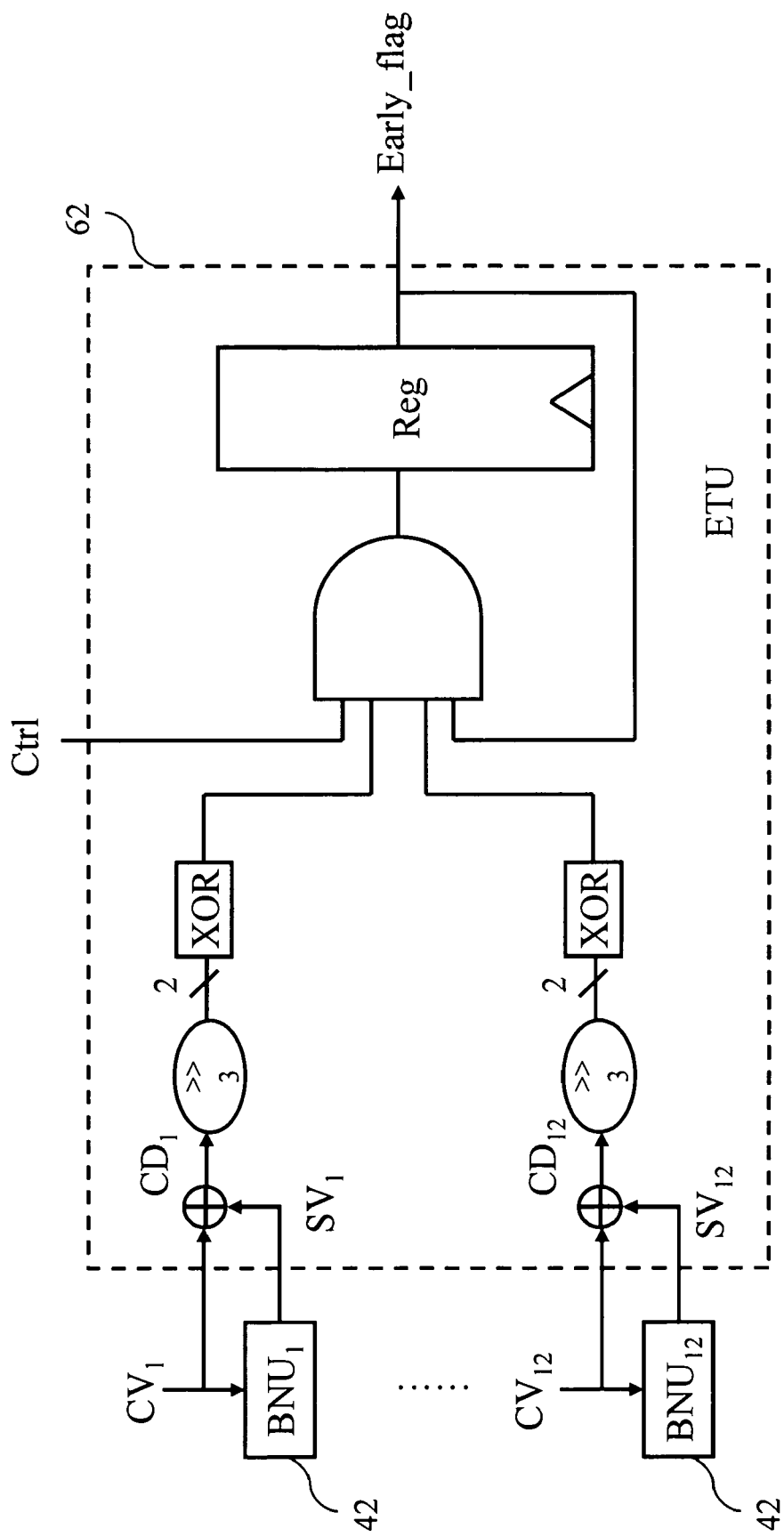
FIG. 9 is a schematic view of the circuit of the disclosed ETU.

FIG. 9 is a schematic view of the circuit of the disclosed ETU. As mentioned before, the ETU 62 performs EETS. It can dynamically adjust the number of iteration times during the decoding process in different communication environments. Generally speaking, the traditional decoding requires a fixed number of iterations (e.g., 8 times) to complete decoding. Even if a fewer number of iterations can achieve the same decoding performance, it still performs the same fixed number of iterations. To avoid unnecessary iterations that waste power, the EETS is employed to dynamically adjust the number of iterations. The EETS is started only when the criterion of the AWA is met (control signal 'Ctrl' is "1"). That is, when the control signal 'Ctrl' in FIG. 8 is true, the control signal is sent to the ETU 62. After the decoding is completed, an early signal 'Early_flag' is generated to stop decoding iterations. Afterwards, a set of decoding bits is output via the output buffer module 50.

In summary, the invention differ from the prior art in that the combination of programmable switches and memory units can perform decoding on a quasi-cyclic-based parity check matrix of dimension M*N. The invention allows the setting of the states of the programmable switches, thereby dynamically determining the size of the decoding matrix. This technique solves the problems in the prior art, improving the usability and flexibility of the decoding matrix.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A programmable low-density parity-check (LDPC) code decoder, comprising:
    a receiving module for receiving log-likelihood ratio (LLR);
    a memory module, which includes:
        a plurality of switched mutual-information memories (SMM's) to form an M*N decoding matrix for storing information exchanged within the decoding matrix; wherein each of the SMM's electrically connects to a set of check node units (CNU's) via a first switch and to a set of bit node unit (BNU's) via a second switch; and
        a plurality of switched channel-value memories (SCM's) for storing the LLR; wherein each of the SCM's electrically connects to the BNU via a third switch;
    a setting module for receiving setting parameters and executing the setting parameters to set the states of the first switch, the second switch, and the third switch;
    a computing module for performing horizontal updating on the decoding matrix via the CNU's and performing vertical updating on the decoding matrix via the BNU's after receiving the LLR and switch state setting is completed, thereby generating a set of decoding bits; and
    an output buffer module for outputting the set of decoding bits after the horizontal updating and the vertical updating are completed.

2. The programmable LDPC code decoder of claim 1 further comprising a circuit module having a wordlength determination unit (WDU) and an early termination unit (ETU) for performing adaptive wordlength assignment (AWA) and efficient early termination scheme (EETS), respectively.

3. The programmable LDPC code decoder of claim 1 further comprising a control unit electrically connecting to each of the SMM's and each of the SCM's and for counting.

4. The programmable LDPC code decoder of claim 2, wherein the WDU and the ETU electrically connect to the BNU simultaneously.

5. The programmable LDPC code decoder of claim 2, wherein the WDU generates a control signal to control the ETU and the BNU.

6. The programmable LDPC code decoder of claim 1, wherein the number of the CNU's is M and the numbers of the BNU's and the SCM's are both N, where M and N are positive integers and M<N.

7. The programmable LDPC code decoder of claim 1, wherein the SMM is mainly a two-port register file and the SCM is mainly a single-port register file.

8. The programmable LDPC code decoder of claim 1, wherein the setting parameters are used to set the SMM's and the SCM's as enabled or disabled.

9. The programmable LDPC code decoder of claim 8, wherein the states of the first switch and the second switch are switched when the SMM's are enabled and the state of the third switch is switched when the SCM's are enabled.

10. A programmable LDPC decoding method, comprising the steps of:
    providing a plurality of SMM's to form an M*N decoding matrix and a plurality of SCM's; wherein each of the SMM's has a first switch and a second switch and each of the SCM's has a third switch;
    receiving setting parameters and using the setting parameters to set the states of the first switch, the second switch, and the third switch;
    receiving an LLR and storing the LLR to the SCM's;
    after receiving the LLR and completing the state setting, performing horizontal updating on the decoding matrix by a set of CNU's and performing vertical updating on the decoding matrix by a set of BNU's, thereby generating a set of decoding bits; and
    outputting the set of decoding bits after the horizontal updating and the vertical updating is completed.

11. The method of claim 10 further comprising the step of using a WDU and an ETU to perform AWA and EETS, respectively.

12. The method of claim 10, wherein the SMM's and the SCM's electrically connect to a control unit for counting.

13. The method of claim 11, wherein the WDU generates a control signal to control the ETU and the BNU.

14. The method of claim 10, wherein the number of the CNU's is M and the numbers of the BNU's and the SCM's are both N, where M and N are positive integers and M<N.

15. The method of claim 10, wherein the SMM is mainly a two-port register file and the SCM is mainly a single-port register file.

16. The method of claim 10, wherein the setting parameters are used to set the SMM's and the SCM's as enabled or disabled.

17. The method of claim 16, wherein the states of the first switch and the second switch are switched when the SMM's are enabled and the state of the third switch is switched when the SCM's are enabled.

* * * * *